US009000762B2

United States Patent
De Rosa et al.

(10) Patent No.: US 9,000,762 B2
(45) Date of Patent: Apr. 7, 2015

(54) CIRCUIT ASSEMBLY AND METHOD FOR PROGRAMMING A HALL SENSOR HAVING AN UPSTREAM CONTROLLER

(71) Applicant: Micronas GmbH, Freiburg (DE)

(72) Inventors: Adriano De Rosa, Badenweiler (DE); Gualtiero Bagnuoli, Turin (IT)

(73) Assignee: Micronas GmbH, Freiburg (DE)

( * ) Notice: Subject to any disclaimer, the term of this patent is extended or adjusted under 35 U.S.C. 154(b) by 251 days.

(21) Appl. No.: 13/728,276

(22) Filed: Dec. 27, 2012

(65) Prior Publication Data

US 2013/0113476 A1    May 9, 2013

Related U.S. Application Data

(62) Division of application No. 12/488,350, filed on Jun. 19, 2009, now Pat. No. 8,362,763.

(30) Foreign Application Priority Data

Jun. 19, 2008 (EP) .................................. 08011108

(51) Int. Cl.
  *G01R 33/07*    (2006.01)
  *G01D 1/18*    (2006.01)
(52) U.S. Cl.
  CPC . *G01R 33/07* (2013.01); *G01D 1/18* (2013.01)

(58) Field of Classification Search
  USPC .............................................. 324/207.2, 251
  See application file for complete search history.

(56) References Cited

U.S. PATENT DOCUMENTS

| 6,288,567 B1 | 9/2001 | Fink |
| 2007/0267990 A1 | 11/2007 | Abolhassani et al. |
| 2008/0272720 A1 | 11/2008 | Kausch |
| 2008/0278891 A1 | 11/2008 | Bidenbach et al. |

FOREIGN PATENT DOCUMENTS

DE    19819265    8/1999

OTHER PUBLICATIONS

Infineon Technologies AG, "Programmable Linear Hall Sensor," Target Data Sheet Infineon (Jan. 1, 2007).
"HAL805 Programmable Linear Hall Effect Sensor," www.datasheetcatalog.org/datasheet/MicronasInternetall/ (Feb. 2, 2000).

*Primary Examiner* — Bot Ledynh
(74) *Attorney, Agent, or Firm* — Muncy, Geissler, Olsd & Lowe, P.C.

(57) ABSTRACT

A circuit assembly having a controller in which the Hall sensor or a programmable circuit component integrated therein is programmed by clocking or modulating a Hall sensor power supply voltage. A clocked or modulated controller power supply voltage is applied to the controller in clocked or modulated form; and where the clock or modulated Hall sensor power supply voltage is applied to the Hall sensor by the controller as a function of the clocked or modulated controller power supply voltage.

8 Claims, 3 Drawing Sheets

CIRCUIT ASSEMBLY AND METHOD FOR PROGRAMMING A HALL SENSOR HAVING AN UPSTREAM CONTROLLER

PRIORITY INFORMATION

This patent application is a divisional of U.S. patent application Ser. No. 12/488,350 filed Jun. 19, 2009, which claims priority from European Patent Application No. 08 011 108.1 filed Jun. 19, 2008.

BACKGROUND OF THE INVENTION

The present invention relates to Hall effect sensors, and in particular to a system and a method for programming a Hall sensor having an upstream controller.

Hall sensors having upstream controllers may be configured and used to monitor battery voltage in automobiles. In this configuration, the Hall sensor may be disposed directly on a battery terminal or a battery line. An upstream controller/control unit, configured as a separate electronic control circuit, analyzes signals received from the Hall sensor.

Typically, a Hall sensor having an integrated circuit component (e.g., an EPROM) is programmed using an external Hall sensor programming control unit. The programming control unit programs the integrated circuit component with a desired characteristic before the Hall sensor is used in the vehicle (e.g., during or after manufacture, but prior to delivery). For example, the Hall sensor programming control unit may be connected to at least one of a plurality (e.g., three) of contact terminals of the Hall sensor. The Hall sensor is programmed by applying a clocked voltage, instead of a power supply voltage, to a Hall sensor power supply voltage terminal. The integrated circuit component (e.g., the EPROM) is programmed via the clocked voltage signal or a modulated voltage signal. A control signal, output via a Hall sensor output terminal, is used to signal the Hall sensor programming control unit to terminate programming when a desired characteristic has been achieved. As the third contact terminal, the Hall sensor and the Hall sensor programming control unit usually have a ground terminal and/or a base terminal.

By configuring the Hall sensor and the controller for triggering the Hall sensor as separate units, the Hall sensor terminals may be accessed and the Hall sensor itself may be programmed, for example, after installation into the vehicle. However, disadvantageously, such an assembly also has a corresponding larger number of components to be installed, which may lead to increased susceptibility to errors in subsequent operations.

There is a need for a Hall sensor, which together with an upstream controller is integrated in a housing, and can be programmed without requiring a direct access connection to contact pins of the Hall sensor.

SUMMARY OF THE INVENTION

According an aspect of the invention, a circuit assembly for programming a Hall sensor includes a Hall sensor and a controller. The Hall sensor includes a Hall sensor power supply voltage terminal for applying a Hall sensor power supply voltage (VDD), a Hall sensor output terminal for providing measured values or a measuring voltage (Vo), and an integrated programmable circuit component that is programmable by clocking or modulation of the Hall sensor power supply voltage (VDD). The controller includes a controller power supply voltage terminal for applying a controller power supply voltage (VBAT) and an internal output terminal for applying a control signal (Vp) which is proportional to or equal to the controller power supply voltage (VBAT), where the internal output terminal is connected to or connectable to the Hall sensor power supply voltage terminal for applying the control signal (Vp) from the controller power supply voltage terminal. The Hall sensor power supply voltage (VDD) is clocked or modulated to provide the control signal (Vp) for programming the circuit component.

According to another aspect of the invention, a method for programming a Hall sensor having a controller in which the Hall sensor or a programmable circuit component integrated therein is programmed by clocking or modulating a Hall sensor power supply voltage (VDD); where a controller power supply voltage (VBAT) is applied to the controller in clocked or modulated form; and where the clock or modulated Hall sensor power supply voltage (VDD) is applied to the Hall sensor by the controller as a function of the clocked or modulated controller power supply voltage (VBAT).

The Hall sensor and the upstream controller may be located within a single housing. The controller includes a controller power supply voltage terminal for applying a controller power supply voltage. The controller also includes an internal output terminal, whose level is proportional or equal to the controller power supply voltage applied to the controller power supply voltage terminal, and the internal output terminal is connected or connectable to the Hall sensor power supply voltage terminal for applying the level from the controller power supply voltage terminal as the clocking or modulation of the Hall sensor power supply voltage for programming the circuit component.

The controller may have an internal voltage output which is connected to the Hall sensor power supply voltage terminal for providing the Hall sensor power supply voltage. Notably, the Hall sensor power supply voltage is typically less than the controller power supply voltage. However, the Hall sensor power supply voltage is high enough for the Hall sensor to operate normally. In addition, a clocked power supply voltage may be applied to the Hall sensor.

The internal voltage output and the internal output terminal are configured as separate terminals, where the internal output terminal may be deactivated or switched to a high impedance. This allows a shutdown of the internal output terminal when the sensor programming is terminated. As a result, a constant sustainable power supply voltage may be applied by the controller to the Hall sensor via the internal voltage output. One terminal thus supplies a constant power supply voltage to the Hall sensor, while the other terminal applies the clocked voltage to the Hall sensor without having to take any special precautions within the controller to be able to output both a constant and a clocked Hall sensor power supply voltage.

The controller may have an internal control signal input terminal connected to the Hall sensor output terminal for applying a control signal that signals the end of the programming.

In one embodiment, the internal control signal input terminal is connected, directly or indirectly, to a controller bus terminal. As a result, the control signal or a control signal derived therefrom may be communicated to a Hall sensor programming control unit situated externally to the housing. The internal control signal input terminal may be connected to the controller, which is programmed or switched for deactivation of the programming.

The internal control signal input terminal may be connected to a logic unit in the controller. This logic or a Hall sensor programming control unit ("sensor control unit") situated outside of the housing may be switched or programmed to deactivate the internal output terminal and/or the internal control signal input terminal after the control signal has been applied. In particular, when the internal input terminal is independent of a measuring signal input, shutdown of the internal output terminal is possible when the programming is concluded. As a result, measured data or measuring signals may be applied to an external circuit or analyzed internally within the controller without having to trigger logic components to control the programming of the Hall sensor.

A method for programming a Hall sensor having an upstream controller is provided where the Hall sensor or a programmable circuit component integrated therein is programmed by clocking or modulation of a Hall sensor power supply voltage. In response, a controller power supply voltage is applied in clocked or modulated form to the controller and a clocked or modulated Hall sensor power supply voltage is applied by the controller to the Hall sensor as a function of the clocked or modulated controller power supply voltage.

After the programming is terminated, the Hall sensor power supply voltage having a constant voltage value is applied by the controller to the Hall sensor. The controller power supply voltage may be applied to the controller. Typically, the controller power supply voltage is less than the clocked or modulated Hall sensor power supply voltage.

After the end of programming, internal terminals of the controller for programming the Hall sensor may be switched to a high impedance level or may be deactivated.

In some embodiments, the Hall sensor provides a termination control signal to the controller to terminate the programming thereof. This control signal for signaling the end of the programming via the controller may be relayed to an external Hall sensor programming control unit. An automotive high voltage control unit, for example in the form of the controller, may be used to interface with the Hall sensor. The automotive control unit may be configured in a shared housing with the external Hall sensor programming control unit.

Due to the configuration of the sensor assembly, programming the Hall sensor prior to installation is possible without having to directly access the terminal contacts of the actual Hall sensor.

In one embodiment, the control device may be configured, for example, having only three controller terminal contacts: a first terminal contact for applying a controller power supply voltage, a second terminal contact for connecting a bus (e.g., a local interconnect network "LIN" bus), and a third terminal contact for the ground terminal. Applying a clocked and/or modulated power supply voltage signal as the controller power supply voltage to the controller has the effect that with a suitable configuration and/or programming of the controller, it functions as an interface for programming the Hall sensor connected thereto.

After the Hall sensor has been programmed, either a corresponding logic in the controller or a control signal sent through to the Hall sensor programming control unit terminates the programming operation. As a result, the controller may be used during measurement operations as a control and/or analysis circuit for the connected Hall sensor.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
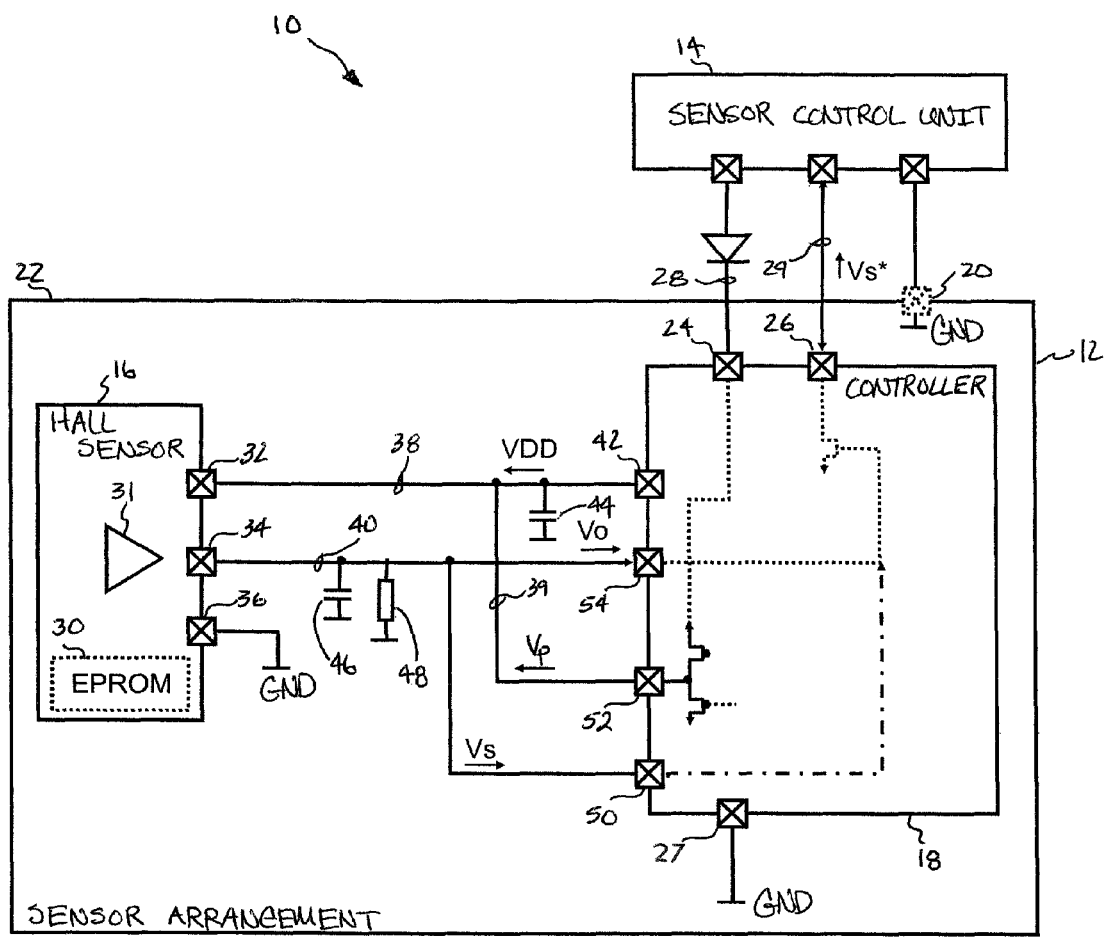
FIG. 1 is a diagrammatic illustration of one embodiment of a Hall sensor system.

FIG. 1 is a diagrammatic illustration of one embodiment of a Hall sensor system 10. The sensor system 10 includes a Hall sensor assembly 12 and a sensor control unit 14. The sensor assembly 12 includes a Hall sensor 16, a controller 18 and a ground ("GND") terminal/contact pin 20 which are configured in a housing 22.

The controller 18 includes a power supply voltage terminal 24, an input/output ("I/O") terminal 26 (also referred to as a "controller bus terminal") and a ground terminal 27. The controller 18 receives a controller power supply voltage ("VBAT voltage signal") from an automotive battery (not shown) via the sensor control unit 14, line 28 and the power supply terminal 24. In an alternate embodiment, the controller 18 may receive the VBAT voltage signal from an automotive battery, thereby bypassing the sensor control unit 14. The controller 18 transmits/receives data to/from the sensor control unit 14 via a local internet network ("LIN") bus 29 and the I/O terminal 26. The ground terminal 27 couples the controller 18 to the ground terminal 20 of the housing 22. Notably, is some embodiments, the power supply terminal 24 and the I/O terminal 22 are configured as part of the sensor assembly 12 and linked to the controller 18 therethrough.

The Hall sensor 16 includes multiple components integrated in a housing. These components include a Hall element 31 and one or more circuit components such as for example, an EPROM 30. As known, the Hall element 31 detects electric current flow using a magnetic field. The EPROM 30 is configured to program and/or calibrate the Hall element 31 and/or to adapt the values measured by the Hall element 31. The Hall sensor 16 includes a voltage supply terminal 32, an output terminal 34 and a ground terminal 36. The voltage supply terminal 32 receives a Hall sensor power supply voltage ("VDD voltage signal") via line 38. The output terminal provides a measuring voltage Vo and/or a sequence of measured values via line 40.

To program the EPROM 30, the controller 18 applies a clock pulse and/or a clocking signal to the VDD voltage signal and communicates the clocked VDD voltage signal to the voltage supply terminal 32 via, for example, lines 38, 39. The programming is terminated when a predetermined characteristic is met within the EPROM 30 and the output terminal 34 outputs a control signal Vs on the line 40.

The controller 18 includes an internal voltage output terminal 42 that provides the VDD voltage signal to the Hall sensor voltage supply terminal 32 via the line 38 during measurement operation. Internal circuit components of the controller 18 are adapted to be switched such that the VBAT voltage signal is transmitted between the power supply terminal 24 and the internal voltage output terminal 42. In some embodiments, the controller 18 may convert the VBAT voltage signal into a VDD voltage signal having, for example, a reduced voltage. For example, in one embodiment, the controller 18 converts a 12 volt VBAT voltage signal to a 5 volt VDD voltage signal.

The Hall sensor 16 and the controller 18 are electrically coupled such that the measuring voltage Vo or corresponding measured values are transmitted from the Hall sensor output terminal 34 to the controller I/O terminal 26. Internal components (e.g., an internal logic) of the controller 18 convert the received measuring voltage Vo or corresponding measured values into data for transmission to the sensor control unit 14 via the LIN bus 29.

In some embodiments, circuit components such as, but not limited to, capacitors and resistors may be coupled between the Hall sensor 16 and the controller 18. For example, as illustrated in FIG. 1, a capacitor 44 is connected to the line 38 between the Hall sensor voltage supply terminal 32 and the controller internal voltage output terminal 42. Capacitor 46 and resistor 48 may be connected to the line 40 between the Hall sensor output terminal 34 and an internal measuring signal input terminal 50 of the controller 18.

To program the Hall sensor with desired characteristics, the sensor control unit 14 (also referred to as a "Hall sensor programming control unit") is connected to the controller 18, and thus the sensor arrangement 12. A programming signal is produced in the sensor control unit 14 by clocking or modulating the VBAT voltage signal. This programming signal (i.e., the clocked VBAT voltage signal) is applied to the controller 18 via the line 28 and the power supply terminal 24. Alternately, the sensor control unit 14 may be replaced by an automotive system (not shown) that receives output signals from the sensor arrangement 12.

The clocked and/or modulated VBAT voltage signal received by the power supply terminal 24 is applied to a transistor circuit (not shown) configured in the controller 18. The transistor circuit has two transistors that are switched in a complementary manner. For example, the two transistors may have jointly wired drain terminals connected to an internal output terminal 52. These circuit components convert the clocked VBAT voltage signal to a Vp voltage signal. The voltage level of the Vp voltage signal is selected to be, for example, as high as possible, without causing damage to the components integrated in Hall sensor 16. The internal output terminal 52 is electrically connected to the voltage supply terminal 32 such that the programming signal (i.e., the Vp voltage signal) is applied to the Hall sensor 16 via the controller 18 in a known manner.

To terminate the programming, the Hall sensor output terminal 34 is connected to an internal control signal input terminal 54 of the controller 18. The control signal Vs is transmitted via the line 40 to the internal control signal input terminal 54 and triggers a program termination sequence. For example, internal components (e.g., an internal logic) of the controller 18 are triggered such that the controller 18 terminates the transmission of the Vp voltage signal (i.e., the programming signal) from the internal output terminal 52 and, in some embodiments, terminates the receipt of additional control signals Vs via the internal control signal input terminal 54.

The internal output terminal 52 and the internal control signal input terminal 54 may be switched to a high impedance mode. Alternatively, the control signal Vs on the line 40 may be converted to data via the controller 18 for transmission to the sensor control unit 14 via the LIN bus 29.

Figure 2:
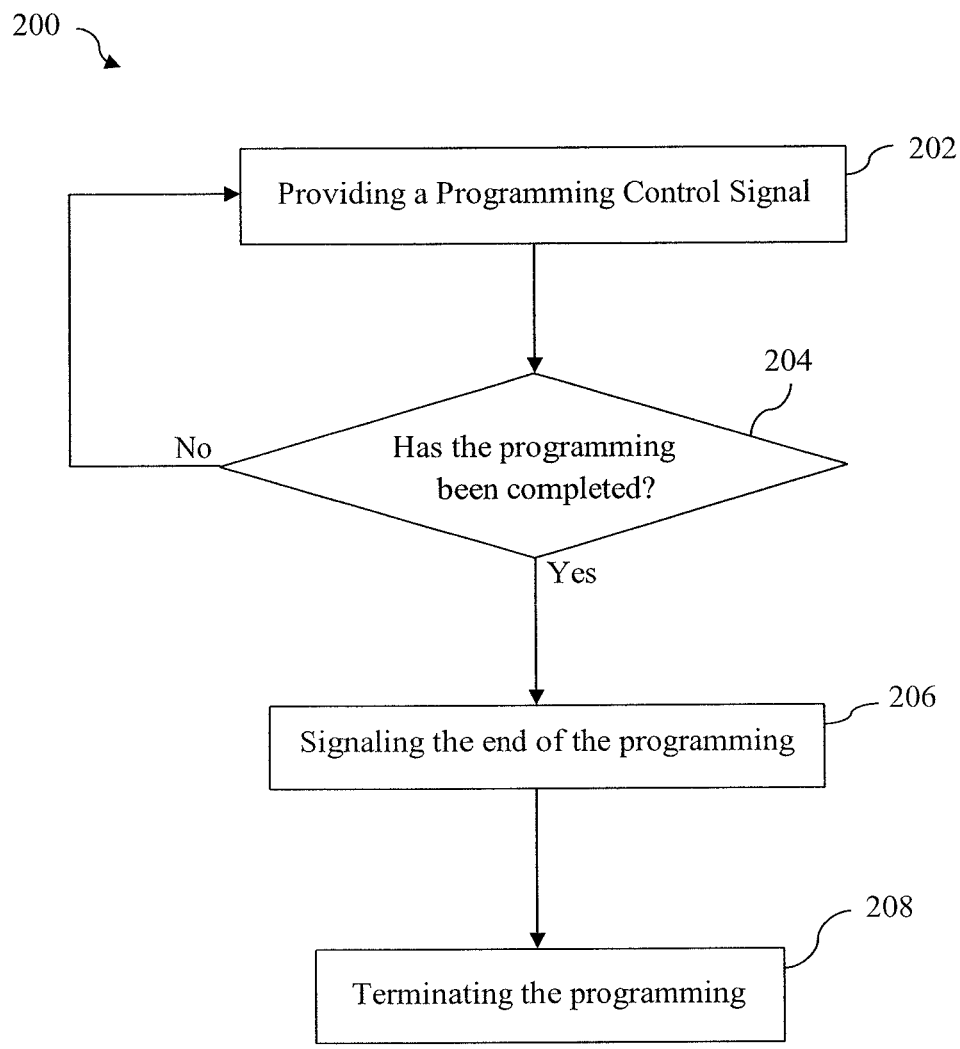
FIG. 2 is a flow chart illustration of a method for programming the sensor system in FIG. 1.

FIG. 2 is a flow chart illustration of a method 200 for programming the sensor arrangement 12 in FIG. 1. Notably, the Hall sensor terminals 32, 34, and thus the Hall sensor 16, are indirectly accessed by the sensor control unit 14 through the controller 18. In step 202, the VBAT voltage signal is clocked via the sensor control unit 14 and the Vp voltage signal is clocked via the controller 18, respectively. Accordingly, a signal is applied to the Hall sensor 16, where the signal corresponds to the clocked VDD voltage signal (i.e., the programming signal) in a known manner.

In step 204, the Hall sensor 16, for example, determines whether the programming of the EPROM 30 or other circuit components configured therein has been completed. Where the programming of the Hall sensor 16 is incomplete, the process in step 202 is repeated. When the programming of the Hall sensor 16 is complete, the control signal Vs is communicated in step 206 from the Hall sensor output terminal 34 to the controller internal control signal input terminal 54 via the line 40 for signaling the end of the programming.

In step 208, the programming is terminated by, for example, deactivating the internal output terminal 52 and the internal control signal input terminal 54 of the controller 18. For example, in one embodiment, signals are not communicated to these controller terminals 52, 54. Alternatively or additionally, these controller terminals 52, 54 are disconnected.

Upon completion of the programming, the controller 18 switches to an actual measurement operation in which the VDD voltage signal, which has a constant voltage level, is applied to the Hall sensor voltage supply terminal 32. The measuring voltage Vo and/or a corresponding measuring signal is received at internal measuring signal input terminal 54 and is supplied, in processed form accordingly for transmission (i.e., converted to data), over the LIN bus 29 via the I/O terminal 26.

During a measurement operation, the terminals of the sensor arrangement 12 may be configured as follows. The I/O terminal 26 is used for a LIN communication over the LIN bus 29. The internal voltage output terminal 42 supplies the Hall sensor 16 with a +5 V VDD voltage signal. The internal output terminal 52 and the internal control signal input terminal 54 are switched to, for example, one of three states. However, these HCV controller terminals 52, 54 are typically not used during a normal measurement operation of the Hall sensor 16. The internal control signal input terminal 54 is used as an analog input terminal for receiving the measuring voltage Vo output by the Hall sensor output terminal 34.

Figure 3:
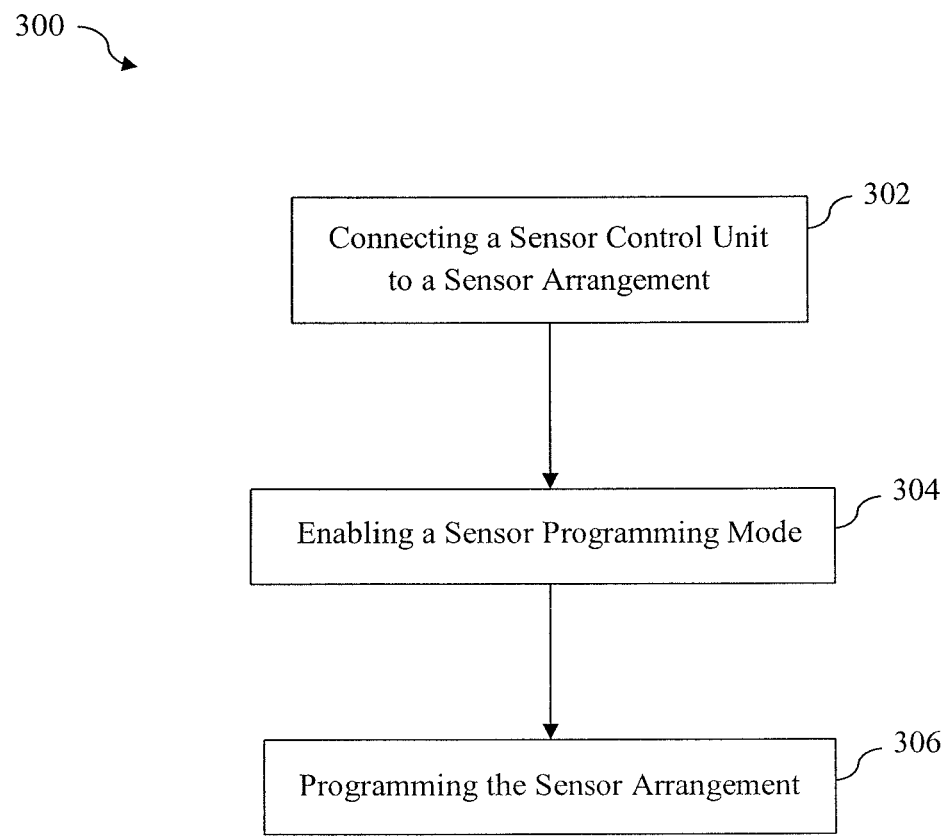
FIG. 3 is a flow chart illustration of a method for manufacturing the sensor system in FIG. 1.

FIG. 3 is a flow chart illustration of method 300 for manufacturing the sensor arrangement 12 in FIG. 1. In step 302, the terminals 20, 24, 26 of the sensor arrangement 12 (FIG. 1) are coupled to the sensor control unit 14. In step 304, a sensor programming mode is selected in the controller 18 after receiving a signal via the LIN bus 29 from the sensor control unit 14.

In step 306, the sensor arrangement 12 is programmed using the method illustrated in FIG. 2, for example, by performing the following steps. LIN operation via LIN bus 29 is terminated, and the I/O terminal 26 is switched as a simple output having an open drain. The internal voltage output terminal 42 is deactivated, such that the VDD voltage signal is no longer transmitted on the line 38. The internal control signal input terminal 54 is configured as a digital input and is adapted for receiving reply signals (e.g., control signal Vs) from the Hall sensor 16. Executable program instructions executing in the controller 18 or a corresponding wiring in the hardware directs input values from the internal control signal input terminal 54 to the I/O terminal 26. These input values are communicated to the sensor control unit 14 via the LIN bus 29. The internal output terminal 52 is set to a normal output mode. The output voltage, i.e., the Vp voltage signal, is selected/set by modulating/varying the voltage of the VBAT voltage signal. For example, the output voltage of the Vp voltage signal is selected as approximately: (i) 5.6 V for a low level VDD voltage signal, (ii) 8.0 V for a high level VDD voltage signal, and (iii) 12.5 V for a programming power supply voltage of the controller 18. It should be noted that the controller 18 is still capable of being operated normally while the Hall sensor 16 is being programmed. Further, during sensor programming, the internal measuring signal input terminal 50 is not used as an analog input.

Although the present invention has been illustrated and described with respect to several preferred embodiments thereof, various changes, omissions and additions to the form and detail thereof, may be made therein, without departing from the spirit and scope of the invention.

What is claimed is:

1. A circuit assembly, comprising:
   a housing;
   a Hall sensor including a Hall sensor power supply voltage terminal for applying a Hall sensor power supply voltage, a Hall sensor output terminal for providing measured values or a measuring voltage, and an integrated programmable circuit component which is programmable by clocking or modulation of the Hall sensor power supply voltage; and
   a controller configured upstream of the Hall sensor, which controller includes a controller power supply voltage terminal for applying a controller power supply voltage and an internal output terminal for applying a control signal which is proportional to or equal to the controller power supply voltage,
   wherein the internal output terminal is connected to or connectable to the Hall sensor power supply voltage terminal for applying the control signal from the controller power supply voltage terminal,
   wherein the Hall sensor power supply voltage is clocked or modulated to provide the control signal for programming the circuit component, and
   wherein the Hall sensor and the upstream controller are configured in the housing.

2. The circuit assembly of claim 1, wherein the controller has an internal voltage output terminal that is connectable to the Hall sensor power supply voltage terminal and outputs the Hall sensor power supply voltage, and wherein the Hall sensor power supply voltage is less than the controller power supply voltage.

3. The circuit assembly of claim 2, wherein the internal voltage output terminal and the internal output terminal are independent terminals, and the internal output terminal is deactivatable or is switchable to a high impedance.

4. The circuit assembly of claim 1, wherein the controller has an internal control signal input terminal connectable to the Hall sensor output terminal for applying a control signal that signals the end of the program.

5. The circuit assembly of claim 4, wherein the internal control signal input terminal is connected directly or indirectly to a controller bus terminal for relaying the control signal or a control signal derived therefrom to a Hall sensor programming control unit configured outside of the housing.

6. The circuit assembly of claim 4, wherein the internal control signal input terminal is connectable to a logic of the controller which is switched or programmed for deactivating the programming.

7. The circuit assembly of claim 4, wherein the internal control signal input terminal is switched to a logic of the controller, and the logic and/or the Hall sensor programming control unit situated outside of the housing is switched or programmed for deactivating the internal output terminal and/or the internal input terminal after the control signal is applied.

8. A sensor assembly disposed in a housing and adapted to receive a first control voltage from a sensor control unit configured outside of the housing, comprising:
   a controller power supply terminal configured to receive the first control voltage;
   a sensor controller comprising a signal converter adapted to convert the first control voltage to a second control voltage which is less than the first control voltage;
   an internal output terminal configured to provide the second control voltage;
   a Hall sensor comprising a Hall sensor power supply voltage terminal coupled to the internal output terminal, which Hall sensor power supply voltage terminal is configured to receive the second control signal; and
   a Hall sensor output terminal configured to provide at least one of measured values and a measuring voltage to the sensor controller; and an integrated programmable circuit component adapted to be programmed by clocking or modulating the first control voltage.

* * * * *